United States Patent [19]

Hooker, Jr.

[11] Patent Number: 5,079,442

[45] Date of Patent: Jan. 7, 1992

[54] APPARATUS ADAPTABLE FOR USE AS A REPLACEMENT OUTPUT DRIVER IN A SIGNAL GENERATING CIRCUIT

[75] Inventor: William H. Hooker, Jr., Austin, Tex.

[73] Assignee: Advanced Micro Devices, Inc., Sunnyvale, Calif.

[21] Appl. No.: 500,725

[22] Filed: Mar. 28, 1990

[51] Int. Cl.$^5$ .............................. H03K 3/26; H01B 7/30
[52] U.S. Cl. ..................................... 307/303; 307/270; 307/147
[58] Field of Search .............. 307/303, 270, 147, 271, 307/479

[56] References Cited

U.S. PATENT DOCUMENTS

| | | | |
|---|---|---|---|
| 4,438,347 | 3/1984 | Gehring | 307/303 |
| 4,697,095 | 9/1987 | Fujii | 307/303 |
| 4,856,079 | 8/1989 | Wedgewood et al. | 375/104 |
| 4,906,872 | 3/1990 | Tanaka | 307/303 |
| 4,970,410 | 11/1990 | Matsushita et al. | 307/303 |

Primary Examiner—Edward P. Westin
Assistant Examiner—Richard Roseen
Attorney, Agent, or Firm—Foley & Lardner

[57] ABSTRACT

An apparatus adaptable for pin-compatible replacement of an output driver in a signal generating circuit which produces an output signal having a predetermined frequency at an output pin. The apparatus comprises a replacement driver module which is configured to generate a replacement output signal at the output pin, which replacement output signal preferably has a significantly higher frequency than the original output signal of the signal generating circuit. In the preferred embodiment, the replacement driver module includes an independent signal generating unit which requires only supply voltage and ground access from the signal generating circuit and generates a signal at the higher replacement frequency, a replacement driver for receiving the replacement signal and generating a replacement output signal, and a pin adaptor for effecting pin-compatible replacement in the signal generating circuit and for communicating the replacement output signal from the replacement driver to the output pin.

12 Claims, 4 Drawing Sheets

APPARATUS ADAPTABLE FOR USE AS A REPLACEMENT OUTPUT DRIVER IN A SIGNAL GENERATING CIRCUIT

BACKGROUND OF THE INVENTION

The present invention relates to output drivers for signal generating circuits, and particularly to a replacement output driver for a signal generating circuit which effects generation of a signal with a frequency different than the original signal produced by the host signal generating circuit before replacement of the original output driver by the output driver of the present invention. Most particularly, the present invention relates to replacement output drivers in a signal generating circuit of a driver board for a test apparatus used with burn-in operations relating to manufacture of semiconductor devices.

An important step in the manufacture of semiconductor devices is burn-in of the devices and testing associated with the burn-in of those devices. Burn-in is an operation by which the manufactured semiconductor devices are situated in an oven and connected electrically to a driver board which is usually situated externally of the oven. The driver board provides signals for powering selected portions of the manufactured devices, which signals serve to test the circuitry of the manufactured devices as well as contribute to the temperature rise associated with the devices during cycling of the oven.

Higher frequencies applied to semiconductor devices during burn-in significantly raise the case temperature of those devices; thus, with a higher frequency drive signal, burn-in time can be reduced. Such a reduction in time allows a consequent realization of increased throughput in manufacturing, and results in increased yield.

The capital expense of an oven and its associated test equipment which incorporates the driver boards for providing signals for burn-in is significantly high. It is, therefore, generally desirable to upgrade existing test equipment, if possible, rather than invest in wholly new equipment in order to realize the reduced burn-in time achievable with higher frequency drive signals during burn-in.

It is, of course, desirable that such upgrading be effected while maintaining the various monitoring and fault-checking signals of the test equipment (which operate using the original frequency signal produced by the test equipment) while still achieving the output via the driver board of the test equipment at a higher frequency, thereby precluding an entire redesign of the test equipment with its associated significant cost.

SUMMARY OF THE INVENTION

The present invention is an apparatus adaptable for pin-compatible replacement of an output driver in a signal generating circuit, which output driver is preferably connected within the signal generating circuit by a plurality of pin connectors. The signal generating circuit produces an output signal having a predetermined frequency at an output pin. The apparatus of the present invention comprises a replacement driver module which is configured to replace the output driver of the signal generating circuit and generate a replacement output signal at the same output pin, which replacement output signal preferably has a significantly higher frequency than the original output signal of the signal generating circuit.

In the preferred embodiment, the replacement driver module includes an independent signal generating unit which requires only supply voltage and ground access from the signal generating circuit and generates a signal at the higher replacement frequency, a replacement driver for receiving the replacement signal and generating a replacement output signal, and a pin adaptor for effecting pin-compatible replacement in the signal generating circuit. The pin adapter communicates the replacement output signal from the replacement driver to the output pin.

It is, therefore, an object of the present invention to provide an apparatus adaptable for pin-compatible replacement of an output driver in a signal generating circuit which produces a replacement output signal to be delivered by the signal generating circuit.

A further object of the present invention is to provide an apparatus adaptable for pin-compatible replacement of an output driver in a signal generating circuit which effects production of a replacement output signal to be delivered by the signal generating circuit without disrupting originally extant monitoring and fault detection circuitry within the signal generating circuit.

Yet a further object of the present invention is to provide an apparatus adaptable for pin-compatible replacement of an output driver in a signal generating circuit which is configured as a replacement module requiring only supply voltage and access to ground from the host signal generating circuit.

Further objects and features of the present invention will be apparent from the following specification and claims when considered in connection with the accompanying drawings illustrating the preferred embodiment of the invention.

DETAILED DESCRIPTION OF THE DRAWING

DETAILED DESCRIPTION OF THE INVENTION

Figure 1:
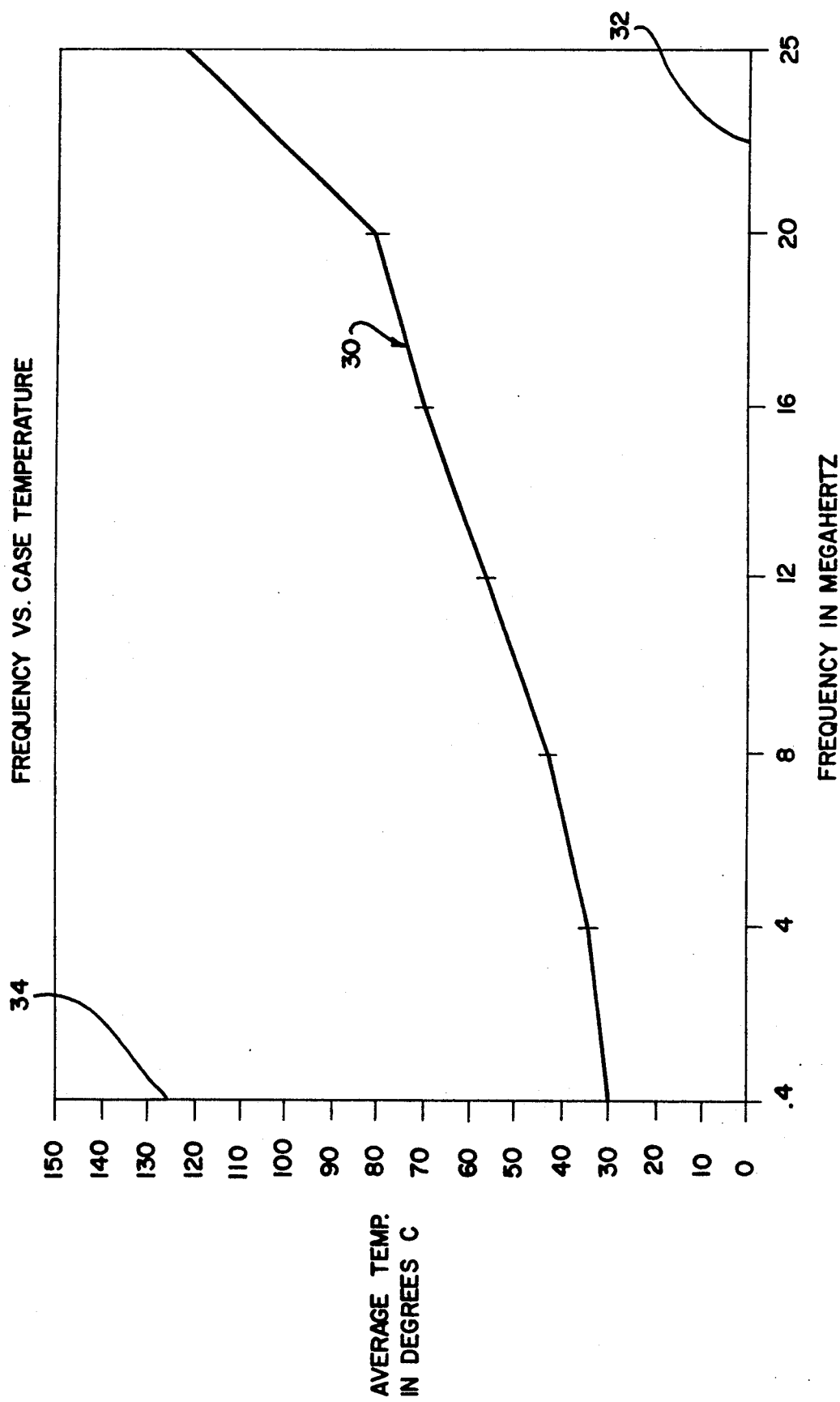
FIG. 1 is a graphic representation of the relationship of frequency of drive signal and case temperature.

FIG. 1 is a graphic representation of the relationship of frequency of drive signal and case temperature of a test semiconductor device during burn-in.

In FIG. 1, a trace 30 indicates the relationship between frequency in MHz of an applied drive signal, plotted along the abscissa 32 of the graph, and average temperature in degrees Centigrade of the case temperature of a semiconductor device subjected to a drive signal indicated along the ordinate 34. As clearly illustrated in FIG. 1, the case temperature of a semiconductor device subjected to a drive signal significantly increases with increased frequency of the drive signal. It is this relationship that is intended to be used to advantage by employing the preferred embodiment of the present invention.

The present invention provides an increased frequency drive signal, particularly in a driver board of a test fixture, as will be described in greater detail hereinafter, to yield a higher temperature in a semiconductor device during testing. Such higher temperatures result in less time being required for effective burn-in of the test devices, with consequent increases in yield and productivity of such devices during manufacture.

Figure 2:
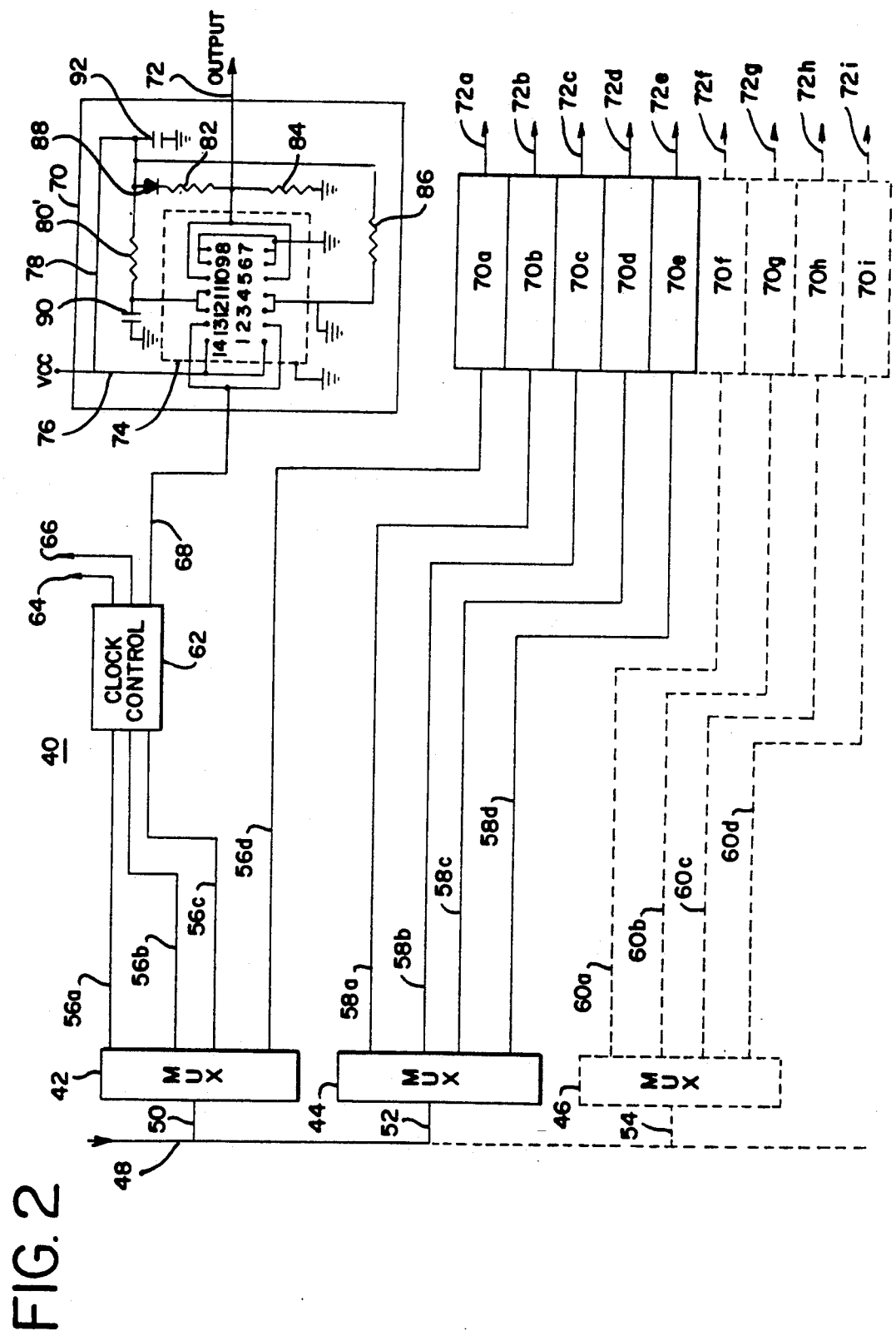
FIG. 2 is a schematic diagram illustrating a typical driver portion of a test circuit employed in burn-in operations for semiconductor devices.

FIG. 2 is a schematic diagram illustrating a typical driver portion of a test circuit employed in burn-in operations for semiconductor devices.

In FIG. 2, a driver circuit 40 is illustrated comprising multiplexers 42, 44, 46. Multiplexer 46 is shown in phantom indicating that additional multiplexers may be contained in the driver circuit 40. Illustration of such additional multiplexers would be redundant and is avoided here since their addition to FIG. 2 would not add to understanding the present invention.

Multiplexers 42, 44, 46 receive an input at line 48 from a signal source (not shown). The input signal applied at line 48 typically has a frequency on the order of 400 KHz. The input signal is applied to multiplexer 42 at input 50, to multiplexer 44 at input 52, and to multiplexer 46 at input 54. Each multiplexer 42, 44, 46 has a plurality of outputs. Thus, multiplexer 42 has representative outputs 56a, 56b, 56c, and 56d; multiplexer 44 has representative outputs 58a, 58b, 58c, and 58d; and multiplexer 46 has representative outputs 60a, 60b, 60c, and 60d.

Outputs 56a, 56b, 56c from multiplexer 42 are applied to clock control circuit 62. Clock control circuit 62 generates a variety of strobe and feedback/fault-checking signals, represented by outputs 64 and 66 in FIG. 2. Strobe signals, represented by output 64, are utilized during test operations to selectively strobe semiconductor test devices (not shown) to ascertain proper function of aspects of those test devices. Feedback/fault-checking signals, represented by output 66, are utilized for self-checking to ensure proper operation of driver circuit 40. Typically, strobe signal outputs 64 and feedback/fault-checking signal outputs 66 have the same frequency as the input signal present at line 48, i.e., 400 KHz.

Clock control circuit 62 also produces a clock signal at output 68 which is applied to an output driver circuit 70. Output driver circuit 70 conditions and amplifies the output signal received from output 68 and produces a system output signal having a frequency of 400 KHz at output pin 72. Output pin 72 provides a system output signal from driver circuit 40 to test devices (not shown) being subjected to burn-in operations.

Other multiplexer outputs 56d, 58a, 58b, 58c, 58d, 60a, 60b, 60c, 60d are applied directly to respective output driver circuits 70a, 70b, 70c, 70d, 70e, 70f, 70g, 70h, 70i, each of which output driver circuits respectively has a system signal output 72a, 72b, 72c, 72d, 72e, 72f, 72g, 72h, 72i.

Output driver circuit 70 is illustrated in detail in FIG. 2 as representative of the remaining output driver circuits 70a–70i. Output driver circuit 70 is comprised of a semiconductor device 74, indicated in phantom in FIG. 2, and supporting circuitry for effecting production of a system output signal at output pin 72. Semiconductor device 74 is typically a driver-type device, such as a 75450 series device, and is situated within output driver circuit 70 by ten pin-connections (labelled 1–10 in FIG. 2). Supply voltage $V_{cc}$ (typically 5 volts DC) is applied to pins 1 and 14 of semiconductor device 74 through line 76. Output 68 from clock control circuit 62 is applied to pins 2 and 13 of semiconductor device 74. $V_{cc}$ is also applied via line 78 to pins 12 and 11, as well as to pins 3 and 4, through a voltage divider circuit comprised of resistors 80, 82, 84, and 86 and diode 88. Undesired alternating signals are coupled to ground through capacitors 90 and 92. Pin 10 and pin 5 of semiconductor device 74 are connected. The system output signal provided at output 72 is produced from pin 10 of semiconductor device 74 at a frequency of 400 KHz.

The present invention is designed to be pin-compatible with the existing 10 pins of semiconductor device 74 in FIG. 2. In its preferred embodiment, the present invention is transparent in its presence within driver circuit 40 when it replaces semiconductor device 74 so that strobe signal output 64 and feedback/fault-checking signal output 66 are in no way altered and, thus, the efficiencies of a higher frequency system output signal at output 72 may be realized without entirely redesigning driver circuit 40. Such an entire redesign would be required to accommodate an input signal at line 48 having the increased frequency produced by the present invention.

Figure 3:
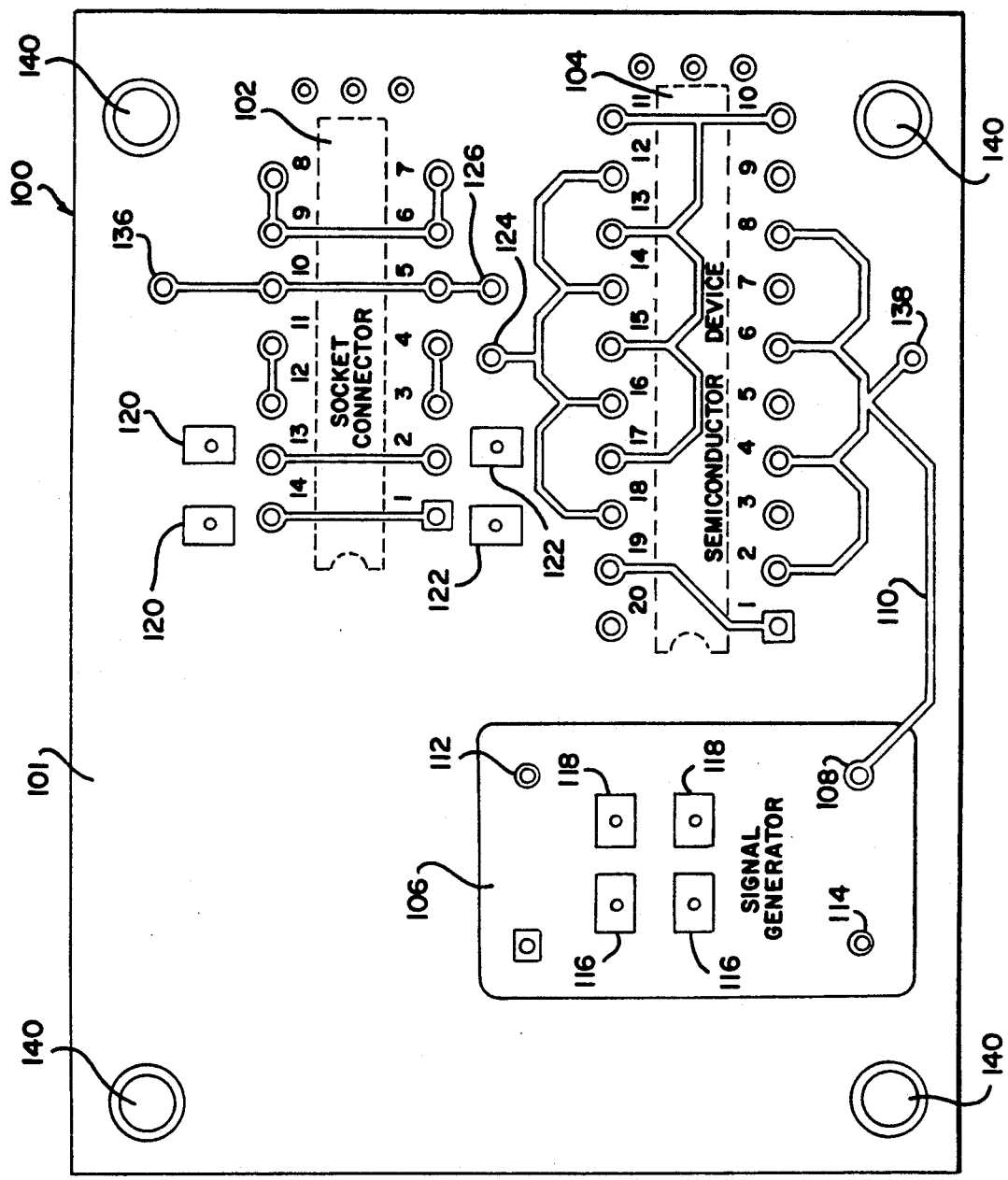
FIG. 3 is a plan view of the top layout of the preferred embodiment of the present invention.

FIG. 3 is a plan view of the preferred embodiment of the present invention. In FIG. 3, a replacement circuit 100 is carried on top of a substrate 101. The circuit 100 includes a through-hole socket connector 102 having 10 pins which are substantially alignable with the 10 pins of semiconductor device 74 of FIG. 2. The pins of through-hole socket connector 102 are interconnected in precisely the same pattern as the interconnections of the pins of semiconductor device 74, FIG. 2. That is, pins 1 and 14 are connected; pins 2 and 13 are connected; pins 12 and 11 are connected; pins 3 and 4 are connected; pins 5 and 10 are connected; and pins 6, 7, 8 and 9 are connected.

Also carried on top of substrate 101 is a semiconductor device 104. Semiconductor device 104 is preferably a CMOS device. In the preferred embodiment illustrated in FIG. 3, semiconductor device 104 has 20 pins for connection and is typically a newer technology driver device than semiconductor device 74, such as a 74HCT244 series semiconductor.

Also carried on top of substrate 101 is a signal generating circuit 106 which produces a test signal output at its pin 108. Pin 108 is connected via line 110 to common connection with pins 2, 4, 6, and 8 of semiconductor device 104.

Further regarding semiconductor device 104, pins 1 and 19 are electrically common; pins 12, 14, 16, and 18 are electrically common; and pins 10, 11, 13, 15, and 17 are electrically common. Pins 3, 5, 7, and 9 are unused. Pin 20 receives supply voltage $V_{cc}$.

Signal generating circuit 106 receives supply voltage $V_{cc}$ at pin 112 and is grounded to system ground through pin 114. Pad pairs 116 and 118 provide connection for decoupling capacitors (not shown in FIG. 3) as commonly known in the art for such signal generating circuits. Similarly, pad pairs 120 and 122 provide contact points for decoupling capacitor connections.

In implementing the preferred embodiment of the present invention and applying semiconductor device 104 and through-hole socket connector 102 to substrate 101, connection is effected between points 124 and 126 to provide the output of semiconductor device 104 to pin 10 and its common pin 5 of through-hole socket connector 102. In such manner, with pin interconnects of through-hole socket connector 102 being identical with pin interconnects of pin-connectors associated with semiconductor device 74 (FIG. 2), removal of semiconductor device 74 from output driver circuit 70 and replacement therewith by insertion of pins 1-10 of through-hole socket connector 102 of replacement circuit 100 provides identical relationships among the supporting circuitry of output drive circuit 70 surrounding semiconductor device 74 (i.e., resistors 80, 82, 84, 86; capacitors 90, 92; diode 88) while providing the output of semiconductor device 104 to output pin 10 (and its common connected pin 5) and, thence, to output 72 of output driver circuit 70. In such manner, the output of replacement semiconductor device 104 is transparently applied to output driver circuit 70.

Figure 4:
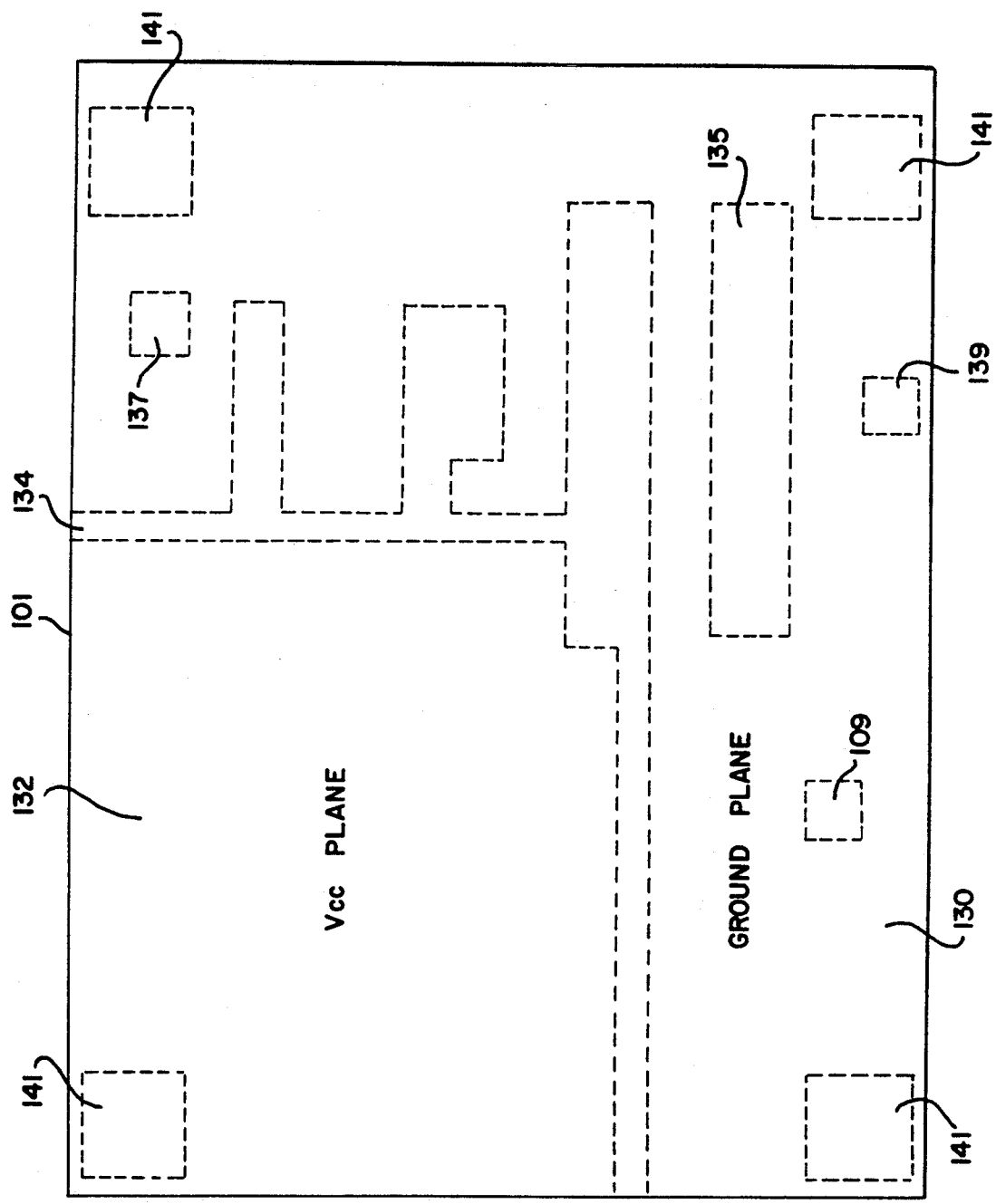
FIG. 4 is a plan view of the bottom layout of the preferred embodiment of the present invention.

FIG. 4 is a plan view of the bottom layout of the preferred embodiment of the present invention. On the bottom of substrate 101, as shown in FIG. 4, are two planes which contribute to the efficiency of employment of space in replacement circuit 100. A ground plane 130 spans selected portions of through-hole socket connector 102, semiconductor device 104, and signal generating circuit 106. In such manner, connection to ground is effected by through-hole connection from the top to the bottom of substrate 101. Similarly, a $V_{cc}$ plane 132 facilitates application of $V_{cc}$ to replacement circuit 100 as appropriate, such as through pin 112 of signal generating circuit 106 and pin 14 of through-hole socket connector 102. A void 134 is provided intermediate ground plane 130 and $V_{cc}$ plane 132 in order to ensure electrical discontinuity between ground plane 130 and $V_{cc}$ plane 132. Void 134 includes pins 10-13 and pins 2-5 of socket connector 102; points 124, 126; and pins 12-19 of semiconductor device 104 in order to establish electrical independence of those pins and points. A void 135 is separately provided to accommodate electrical independence of pins 2-9 of semiconductor device 104.

Pad pairs 116, 118, 120, and 122 each are situated with a first pad electrically associated with ground plane 130 and a second pad electrically associated with $V_{cc}$ plane 132. Pins 2 and 13 of through-hole socket connector 102 are situated within void 134 so that when replacement circuit 100 replaces semiconductor device 74 by insertion of the ten pins of through-hole socket connector 102 in the ten pins in output driver circuit 70, receipt of signals from output 68 of clock control circuit 62 is blocked. In such manner, replacement circuit 100 provides, transparently and through pin-compatible connection, a replacement output signal at output 72 without affecting strobe signal output 64 or feedback/fault-checking signal output 66 in any way.

Replacement circuit 100 includes test points 136, 138 and mounting holes 140. Ground plane 130 and $V_{cc}$ plane 132 have a void 137 surrounding test point 136, a void 139 surrounding test point 138, and voids 141 surrounding mounting holes 140. Also, void 109 in ground plane 130 surrounds output pin 108 of signal generating circuit 106.

It is to be understood that, while the detailed drawings and specific examples given describe preferred embodiments of the invention, they are for the purpose of illustration only, that the apparatus of the invention is not limited to the precise details and conditions disclosed and that various changes may be made therein without departing from the spirit of the invention which is defined by the following claims:

I claim:

1. An apparatus adaptable for pin-compatible replacement of an output driver in a signal generating circuit, said output driver being connected within said signal generating circuit by a plurality of contact pins, said output driver producing an output signal at an output pin in response to a clock signal, said output signal having a first frequency, the apparatus comprising a replacement driver module, said replacement driver module being configured to replace said output driver, said replacement driver module generating a replacement output signal at said output pin when replacement of said output driver by said replacement module is effected, said replacement output signal having a second frequency; said replacement driver module comprising:

a signal generator means for generating a replacement clock signal, said replacement clock signal having said second frequency;
   a replacement driver means for receiving said replacement clock signal and generating said replacement output signal; and
   a pin adaptor means for effecting said pin-compatible replacement, said pin adaptor means operatively connecting said replacement output signal from said replacement driver means to said output pin.

2. An apparatus adaptable for pin-compatible replacement of an output driver in a signal generating circuit as recited in claim 1 wherein said pin adaptor means has a plurality of pin connections substantially alignable with said plurality of contact pins, said plurality of contact pins having predetermined first inter-pin connections, and said plurality of pin connections having predetermined second inter-pin connections, said first inter-pin connections and said second inter-pin connections being substantially identical.

3. An apparatus adaptable for pin-compatible replacement of an output driver in a signal generating circuit as recited in claim 1 wherein said replacement driver module further comprises a generally planar substrate means for supporting said signal generator means, said substrate means having a first side and a second side; said signal generator means, said replacement driver means, and said pin adaptor means being situated on said first side; said substrate means having at least two mutually electrically isolated, electrically conductive lands on said second side.

4. An apparatus adaptable for pin-compatible replacement of an output driver in a signal generating circuit as recited in claim 3 wherein said at least two conductive lands comprises two conductive lands, a first of said conductive lands effecting operative connection of supply voltage between said signal generating circuit and said replacement driver module; a second of said conductive lands effecting operative connection between said replacement driver module and ground.

5. An apparatus adaptable for pin-compatible replacement of an output driver in a signal generating circuit as recited in claim 2 wherein said replacement driver module further comprises a generally planar substrate means for supporting said signal generator means, said substrate means having a first side and a second side; said signal generator means, said replacement driver means, and said pin adaptor means being situated on said first side; said substrate means having at least two mutually electrically isolated, electrically conductive lands on said second side.

6. An apparatus adaptable for pin-compatible replacement of an output driver in a signal generating circuit as recited in claim 5 wherein said at least two conductive lands comprises two conductive lands, a first of said conductive lands effecting operative connection of supply voltage between said signal generating circuit and said replacement driver module; a second of said conductive lands effecting operative connection between said replacement driver module and ground.

7. An apparatus adaptable for pin-compatible replacement of an output driver in a signal generating circuit, said output driver being connected within said signal generating circuit by a plurality of contact pins, said signal generating circuit generating a monitoring signal having a first frequency, said monitoring signal being employed to monitor operation of said signal generating circuit, said output driver producing an output signal at an output pin in response to a clock signal, said output signal having said first frequency, the apparatus comprising a replacement driver module, said replacement driver module being configured to replace said output driver, said replacement driver module generating a replacement output signal at said output pin without affecting said monitoring signal when replacement of said output driver by said replacement module is effected, said replacement output signal having a second frequency;

said replacement driver module comprising:
a signal generator means for generating a replacement clock signal, said replacement clock signal having said second frequency;
a replacement driver means for receiving said replacement clock signal and generating said replacement output signal; and
a pin adaptor means for effecting said pin-compatible replacement, said pin adaptor means operatively connecting said replacement output signal from said replacement driver means to said output pin.

8. An apparatus adaptable for pin-compatible replacement of an output driver in a signal generating circuit as recited in claim 7 wherein said pin adaptor means has a plurality of pin connections substantially alignable with said plurality of contact pins, said plurality of contact pins having predetermined first inter-pin connections, and said plurality of pin connections having predetermined second inter-pin connections, said first inter-pin connections and said second inter-pin connections being substantially identical.

9. An apparatus adaptable for pin-compatible replacement of an output driver in a signal generating circuit as recited in claim 7 wherein said replacement driver module further comprises a generally planar substrate means for supporting said signal generator means, said substrate means having a first side and a second side; said signal generator means, said replacement driver means, and said pin adaptor means being situated on said first side; said substrate means having at least two mutually electrically isolated, electrically conductive lands on said second side.

10. An apparatus adaptable for pin-compatible replacement of an output driver in a signal generating circuit as recited in claim 9 wherein said at least two conductive lands comprises two conductive lands, a first of said conductive lands effecting operative connection of supply voltage between said signal generating circuit and said replacement driver module; a second of said conductive lands effecting operative connection between said replacement driver module and ground.

11. An apparatus adaptable for pin-compatible replacement of an output driver in a signal generating circuit as recited in claim 8 wherein said replacement driver module further comprises a generally planar substrate means for supporting said signal generator means, said substrate means having a first side and a second side; said signal generator means, said replacement driver means, and said pin adaptor means being situated on said first side; said substrate means having at least two mutually electrically isolated, electrically conductive lands on said second side.

12. An apparatus adaptable for pin-compatible replacement of an output driver in a signal generating circuit as recited in claim 11 wherein said at least two conductive lands comprises two conductive lands, a first of said conductive lands effecting operative connection of supply voltage between said signal generating circuit and said replacement driver module; a second of said conductive lands effecting operative connection between said replacement driver module and ground.

* * * * *